United States Patent
Zhang et al.

(10) Patent No.: US 10,128,272 B2
(45) Date of Patent: Nov. 13, 2018

(54) THIN FILM TRANSISTOR ARRAY SUBSTRATE, METHOD FOR FABRICATING THE SAME AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiaxiang Zhang, Beijing (CN); Jian Guo, Beijing (CN); Xiaohui Jiang, Beijing (CN); Changjiang Yan, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/421,279

(22) PCT Filed: Apr. 28, 2014

(86) PCT No.: PCT/CN2014/076403
§ 371 (c)(1),
(2) Date: Feb. 12, 2015

(87) PCT Pub. No.: WO2015/103826
PCT Pub. Date: Jul. 16, 2015

(65) Prior Publication Data
US 2015/0311224 A1    Oct. 29, 2015

(30) Foreign Application Priority Data
Jan. 8, 2014    (CN) .......................... 2014 1 0008783

(51) Int. Cl.
*H01L 27/12* (2006.01)
*H01L 21/84* (2006.01)
(Continued)

(52) U.S. Cl.
CPC ...... *H01L 27/124* (2013.01); *G02F 1/133555* (2013.01); *G02F 1/134363* (2013.01);
(Continued)

(58) Field of Classification Search
CPC .................................................. H01L 27/1262
See application file for complete search history.

(56) References Cited

U.S. PATENT DOCUMENTS 5,434,690 A * 7/1995 Hisatake ........... G02F 1/134336
349/136
6,259,503 B1 * 7/2001 Watanabe ......... G02F 1/134363
349/129

(Continued)

FOREIGN PATENT DOCUMENTS

CN        1603915 A     4/2005
CN     101078841 A    11/2007
(Continued)

OTHER PUBLICATIONS

International Search Report and Written Opinion of the International Searching Authority with Notice of Transmittal of the International Search Report and Written Opinion of PCT/CN2014/076403 in Chinese, dated Oct. 20, 2014.
(Continued)

*Primary Examiner* — Lex Malsawma
(74) *Attorney, Agent, or Firm* — Collard & Roe, P.C.

(57) ABSTRACT

Disclosed are a TFT array substrate, a method for fabricating the same and a display device. The TFT array substrate includes a plurality of pixel units, each of the plurality of pixel units includes a common electrode (9). The common
(Continued)

electrode (9), is comb-shaped, and includes a plurality of strip electrodes and a plurality of slits. Each of the strip electrodes is configured for reflecting light incident on the strip electrode, and each of the slits is configured for transmitting light incident on the slit. As the comb-shaped common electrode with both a reflective region and a transmissive region is formed through a single patterning process, the fabrication process is simplified and the fabrication cost and difficulty are reduced.

9 Claims, 5 Drawing Sheets

(51) Int. Cl.
G02F 1/1335 (2006.01)
G02F 1/1343 (2006.01)

(52) U.S. Cl.
CPC .............. H01L 21/84 (2013.01); H01L 27/12 (2013.01); H01L 27/1262 (2013.01); *G02F 2001/134318* (2013.01)

(56) References Cited

U.S. PATENT DOCUMENTS

| | | | | |
|---|---|---|---|---|
| 8,330,887 | B2 * | 12/2012 | Kurokawa | G02F 1/1368 349/43 |
| 9,250,477 | B2 * | 2/2016 | Chen | G02F 1/133707 |
| 9,829,761 | B2 * | 11/2017 | Kimura | G02F 1/136286 |
| 2002/0036742 | A1 * | 3/2002 | Kimura | G02F 1/1345 349/139 |
| 2003/0128323 | A1 * | 7/2003 | Matsumoto | G02F 1/136213 349/141 |
| 2003/0218664 | A1 * | 11/2003 | Sakamoto | G02F 1/133555 347/114 |
| 2005/0105033 | A1 | 5/2005 | Itou et al. | |
| 2006/0197890 | A1 * | 9/2006 | Wu | G02F 1/1309 349/113 |
| 2006/0268206 | A1 * | 11/2006 | Nishimura | G02F 1/134363 349/114 |
| 2007/0268440 | A1 | 11/2007 | Nagano | |
| 2008/0239181 | A1 | 10/2008 | Jin | |
| 2009/0021664 | A1 * | 1/2009 | Yamazaki | H01L 27/12 349/47 |
| 2009/0109391 | A1 * | 4/2009 | Ito | G02F 1/134363 349/141 |
| 2012/0162561 | A1 * | 6/2012 | Kimura | G02F 1/134363 349/43 |
| 2012/0187405 | A1 * | 7/2012 | Imamura | G02F 1/134363 257/59 |
| 2013/0063686 | A1 * | 3/2013 | Tashiro | G02F 1/133707 349/98 |

FOREIGN PATENT DOCUMENTS

| | | |
|---|---|---|
| CN | 101276106 A | 10/2008 |
| CN | 202084547 U | 12/2011 |
| CN | 203658713 U | 6/2014 |

OTHER PUBLICATIONS

Chinese Office Action of Chinese Application No. 201410008783.8, dated Oct. 23, 2015 with English translation.
Third Chinese Office Action in Chinese Application No. 201410008783.8, dated Jul. 14, 2016 with English translation.
English translation of the International Preliminary Report on Patentability and Written Opinion of the International Searching Authority of PCT/CN2014/076403, dated Jul. 12, 2016.
Second Chinese Office Action in Chinese Application No. 201410008783.8, dated Mar. 14, 2016 with English translation.

* cited by examiner

THIN FILM TRANSISTOR ARRAY SUBSTRATE, METHOD FOR FABRICATING THE SAME AND DISPLAY DEVICE

CROSS REFERENCE TO RELATED APPLICATIONS

This application is the National Stage of PCT/CN2014/076403 filed on Apr. 28, 2014, which claims priority under 35 U.S.C. § 119 of Chinese Application No. 201410008783.8 filed on Jan. 8, 2014, the disclosure of which is incorporated by reference.

FIELD OF THE ART

Embodiments of the invention relate to a Thin Film Transistor (TFT) array substrate, a method for fabricating the same and a display device comprising the TFT array substrate.

BACKGROUND

Liquid Crystal Display (LCD) panels have the advantages of low power consumption, low radiation and low fabrication cost and are widely used in various electronic devices such as display device, televisions, mobile phones and digital cameras. LCD panels are passive light emitting devices and are classified into reflective LCDs, transmissive LCDs and transflective LCDs, based on different light sources.

Transflective LCD panels possess characteristics of both transmissive LCDs and reflective LCDs and have both a backlight and a reflective layer, which makes it possible to use light emitted by the backlight therein and the ambient light in operation.

SUMMARY

Embodiments of the invention provide a TFT array substrate, a method for fabricating the same and a display device.

A first aspect of the invention provides a TFT array substrate. The TFT array substrate comprises a plurality of pixel units, each of the pixel units comprises a common electrode, wherein the common electrode is comb-shaped, and the common electrode comprises a plurality of strip electrodes and a plurality of slits, wherein each of the strip electrodes is configured for reflecting light incident on the strip electrode, and each of the slits is configured for transmitting light incident on the slit.

A second aspect of the invention provides a display device comprising the above TFT array substrate.

A third aspect of the invention provides a method for fabricating a TFT array substrate, wherein the TFT array substrate comprises a comb-shaped electrode. The method comprises: forming a pattern of the comb-shaped common electrode through a single patterning process, wherein the comb-shaped common electrode comprises a plurality of strip electrodes and a plurality of slits, each of the strip electrodes is configured for reflecting light incident on the strip electrode, and each of the slits is configured for transmitting light incident on the slit.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
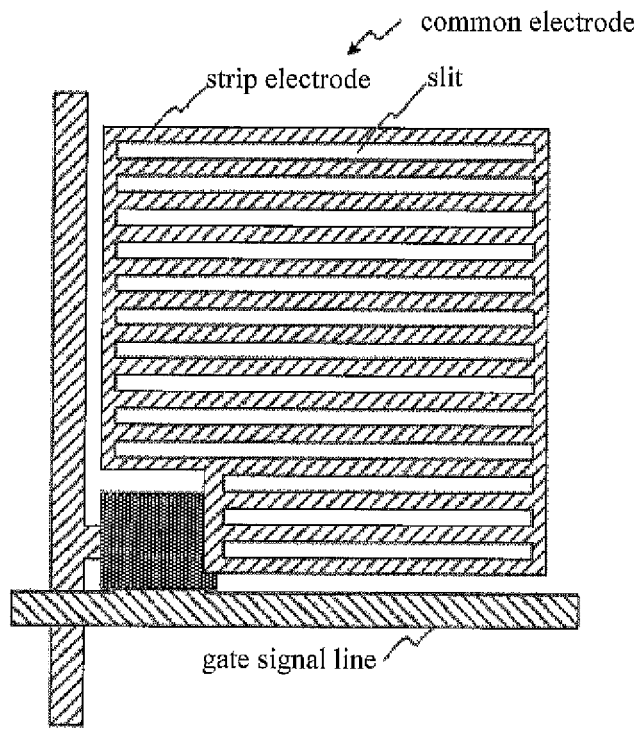
FIG. 1A schematically illustrates a first arrangement pattern of a common electrode in accordance with an embodiment of the invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

According to conventional methods for fabricating a transflective LCD panel, a patterning process for fabricating a pixel electrode is generally followed by another patterning process for fabricating a reflective layer on the pixel electrode, such that ambient light may be reflected to a liquid crystal layer. As the reflective layer has to be fabricated separately during the fabrication procedure of the transflective LCD panels, the fabrication process is made complicated and the fabrication difficulty is increased. Meanwhile, the fabrication cost is also increased as the number of masks is increased.

An embodiment of the invention provides a TFT array substrate comprising a plurality of pixel units, and each of the pixel units comprises a common electrode. The common electrode is comb-shaped, and the common electrode comprises a plurality of strip electrodes and a plurality of slits, wherein the plurality of the strip electrodes is configured for reflecting light incident on the strip electrode, and the plurality of the slits is configured for transmitting light incident on the slit.

In this embodiment, the strip electrodes in the common electrode function as reflective regions of the TFT array substrate other than being an electrode in itself. Moreover, the slits in the common electrode function as the transmissive regions of the TFT array substrate, thereby achieving the transflective effect. The fabrication process is simplified and the fabrication complexity and cost are reduced, as the common electrode with both the reflective and transmissive regions is fabricated through a single patterning process.

In some embodiments, a material of the strip electrode is a metal with a resistivity equal to or less than 50 Ω/cm2 and has light-reflective property.

Normal deflection of liquid crystals in the liquid crystal layer is not affected, as the slits in the common electrode can transmit light incident thereon. Moreover, charging capacity of the common electrode is enhanced and charging time is reduced, as the strip electrodes are made of a metal with a low resistivity.

In some embodiments, a material of the above strip electrodes is aluminum (Al), titanium (Ti) or other metal materials meeting the above requirements.

To generate homogeneous electric fields between the common electrode and the pixel electrode and to prevent uneven brightness of the same sub-pixel caused by different liquid crystal deflection, in some embodiments, the common electrode may employ any of the following structures.

In a first structure, the plurality of strip electrodes are of a same width, such that luminous intensity reflected by each strip electrode (i.e., light reflective region) is homogenous.

In a second structure, the plurality of slits are of a same width, such that luminous intensity transmitted by each slit (i.e., light transmissive region) is homogenous.

In a third structure, the plurality of strip electrodes are of a same width and the plurality of slits are of a same width, such that the luminous intensity reflected by each strip electrode (i.e. light reflective region) is homogenous, and the luminous intensity transmitted by each slit (i.e. light transmissive region) is homogenous.

In some embodiments, a ratio between a total area of the plurality of strip electrodes and that of the plurality of slits in each of the common electrode is 3:5, such that a better effect of reflection and transmission is achieved. Dark stripes might form in the pixel region if the ratio between the total areas is greater than 3:5. Meanwhile, the light transmitivity will be reduced, if the ratio is smaller than 3:5. In other embodiments, the total area of the plurality of strip electrodes and that of the plurality of slits is of other ratios.

In some embodiments, the TFT array substrate further comprises a plurality of gate signal lines and a plurality of data signal lines disposed as intersecting each other, wherein each slit of each of the common electrodes is disposed according to the following arrangement pattern.

In a first arrangement pattern, each of the slits is disposed as parallel to the gate signal lines in the TFT array substrate.

For example, as illustrated in FIG. 1A, a common electrode of a pixel unit comprises a plurality of slits which are equally spaced apart from each other, and each of the slits is disposed as parallel to the gate signal lines.

In a second arrangement pattern, each of the slits is disposed as parallel to the data signal lines in the TFT array substrate.

Figure 1B:
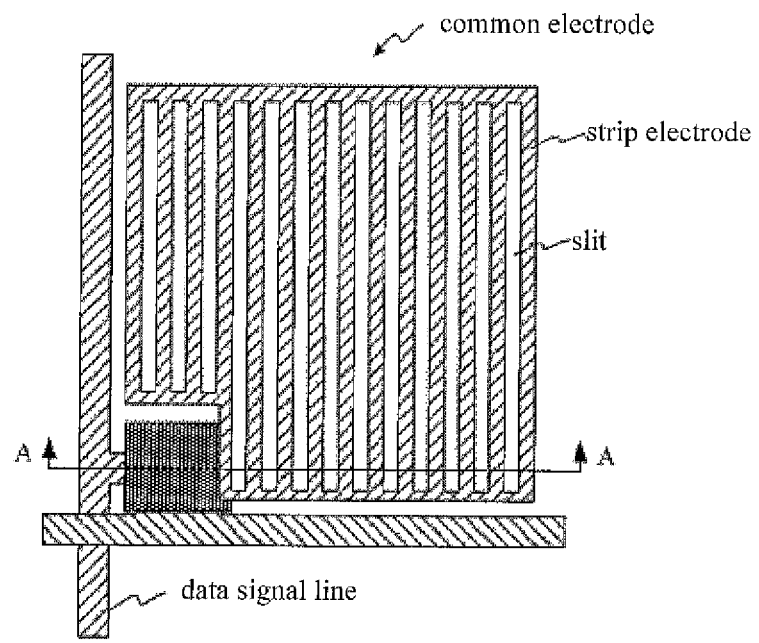
FIG. 1B schematically illustrates a second arrangement pattern of a common electrode in accordance with an embodiment of the invention.

For example, as illustrated in FIG. 1B, a common electrode of a pixel unit comprises a plurality of slits which are equally spaced apart from each other, and each of the slits is disposed as parallel to the data signal lines.

In a third arrangement pattern, each of the slits is disposed obliquely as having an angle with the gate signal lines.

Figure 1C:
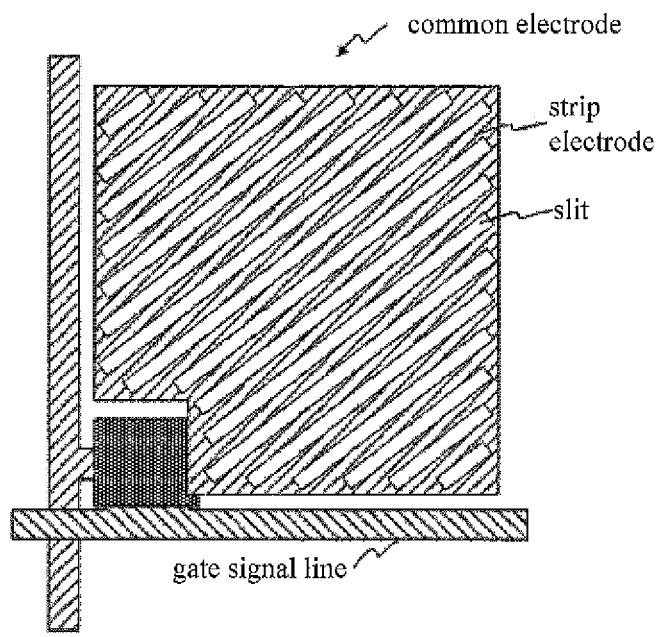
FIG. 1C schematically illustrates a third arrangement pattern of a common electrode in accordance with an embodiment of the invention.

As an example, a common electrode of a pixel unit comprises a plurality of slits which are equally spaced apart from each other, and each of the slits is disposed obliquely as having an angle, of great than 0 degree and smaller than 90 degrees, with the gate signal lines. As an example, the angle is 45 degrees as illustrated in FIG. 1C For the convenience of description, only one pixel unit is illustrated in FIGS. 1A, 1B, 1C. It can be contemplated that other pixel units may have identical pattern to it.

Another embodiment of the invention provides a method for fabricating a TFT array substrate. The method comprises:

forming a pattern of a common electrode having a plurality of strip electrodes and a plurality of slits through a single patterning process, wherein the plurality of the strip electrode reflects light incident thereon, and the plurality of the slits transmits light incident thereon.

Example 1

Figure 2A:
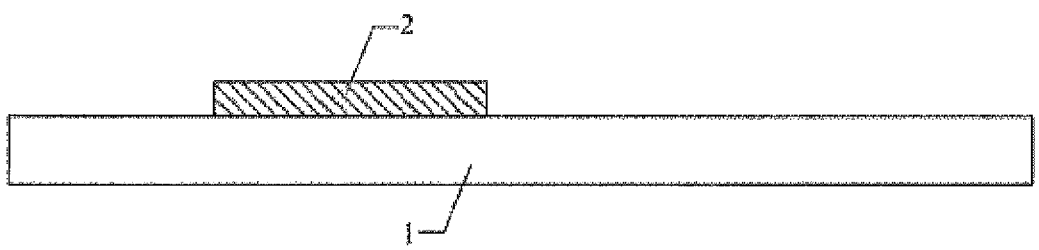
FIGS. 2A~2G schematically illustrate individual steps of fabricating a TFT array substrate in accordance with an embodiment of the invention.
Figure 2B:
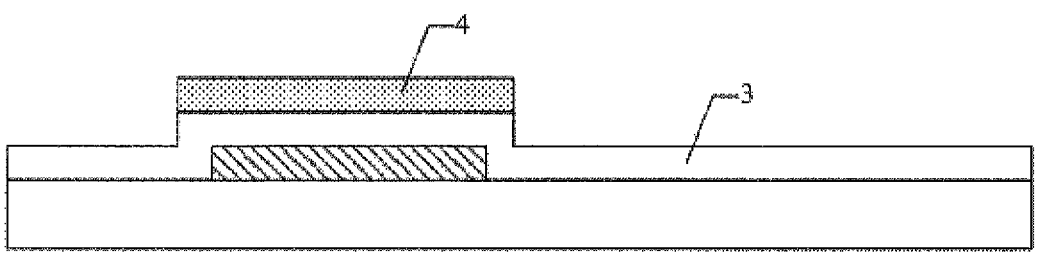
Figure 2C:
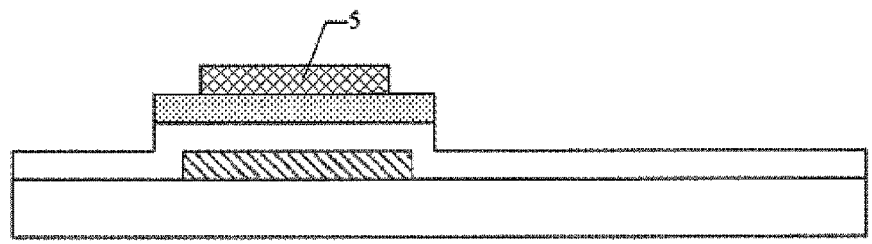

In the following, a method for fabricating a TFT array substrate provided by the embodiment of the invention will be described with reference to an example of a TFT array substrate an illustrated in FIG. 1B. FIGS. 2A~2G schematically illustrate cross sections taken along A-A of FIG. 1B. With reference to FIGS. 2A~2C; the method for fabricating the TFT array substrate in accordance with the embodiment of the invention comprises the following steps:

(1) A gate electrode 2 is formed on a base substrate 1, as illustrated in FIG. 2A;

As an example, a metal layer (such as molybdenum Mo, aluminum Al, and so on) is deposited on the base substrate (such as a glass substrate) and a pattern of the gate electrode is formed through a first photolithography and a wet etching process.

(2) A gate insulation layer 3 and an active layer 4 are subsequently formed on the base substrate having the gate electrode 2 formed thereon, as illustrated in FIG. 2B;

As an example, a gate insulation (GI) film and an oxide semiconductor film (such as Indium Gallium Zinc Oxide (IGZO) and the like) are subsequently deposited on the base substrate having the gate electrode formed thereon, and a pattern of the active layer is formed through a second photolithography and a wet etching process.

The GI film may be a single layer film made of SiNx, SiOx, SiOxNy, or a compound layer made of at least two materials selected from SiNx, SiOx, and SiOxNy.

In another embodiment, the active layer is made of amorphous silicon.

(3) An etch stop layer 5 is formed on the base substrate having the active layer 4 formed thereon, as illustrated in FIG. 2C:

As an example, an etch stop layer film (such as SiO2 and the like) is deposited on the base substrate having the active layer formed thereon, and a pattern of the etch stop layer is formed through a third photolithography and a dry etching process.

Figure 2D:
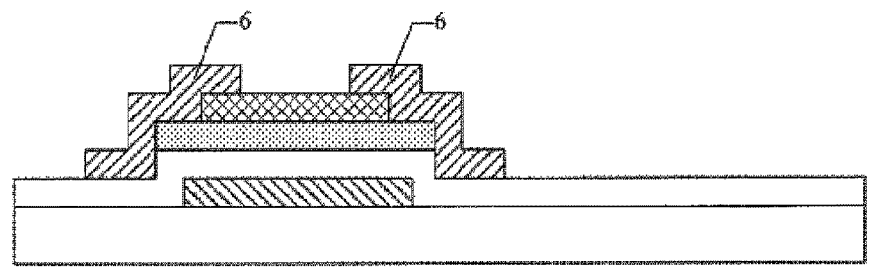

(4) A source/drain electrode 6 is formed on the base substrate having the etch stop layer 5 formed thereon, as illustrated in FIG. 2D;

As an example, a metal film (such as aluminum Al, titanium Ti and the like) is deposited on the base substrate having the etch stop layer formed thereon, and the source/drain electrode is formed through a fourth photolithography and a wet etching process.

Figure 2E:
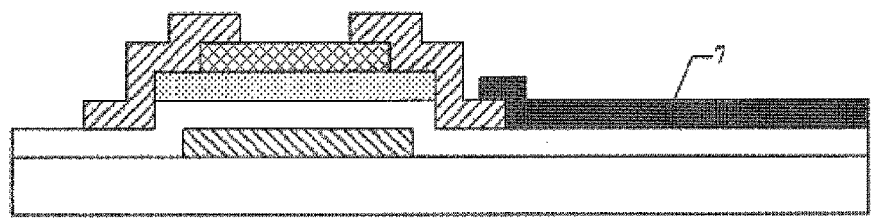

(5) A pixel electrode 7 is formed on the base substrate having the source/drain electrode 6 formed thereon, as illustrated in FIG. 2E;

As an example, a transparent conductive film (such as Indium-Tin Oxide (ITO) and the like) is deposited on the base substrate having the source/drain electrode formed thereon, and the pixel electrode is formed through a fifth photolithography and a wet etching process.

Figure 2F:
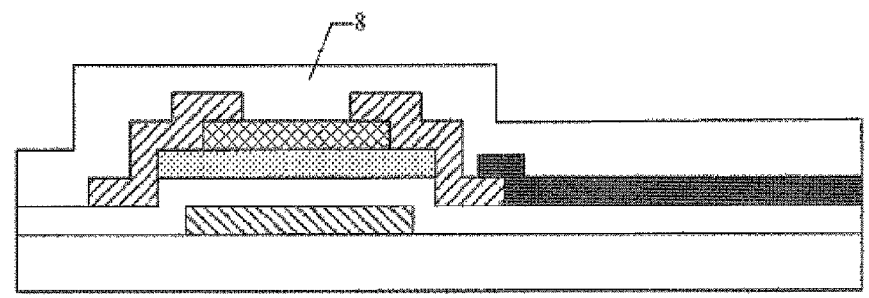

(6) An insulation protection (PVX) layer 8 is formed on the base substrate having the pixel electrode 7 formed thereon, as illustrated in FIG. 2F.

As an example, a PVX film (such as SiN, SiO2 and the like) is deposited on the base substrate having the pixel electrode formed thereon, and a PVX via hole corresponding to a peripheral circuit is formed through a sixth photolithography and a dry etching process.

Figure 2G:
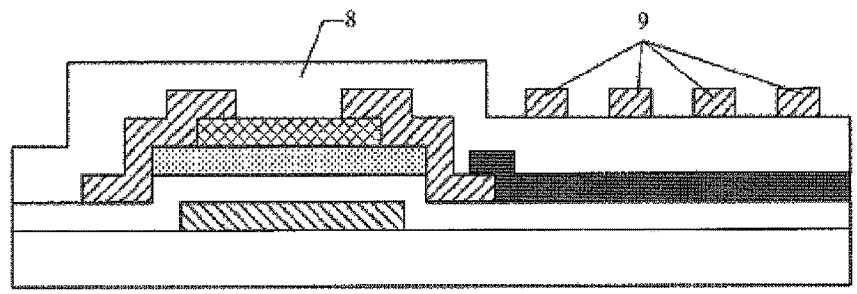

(7) A common electrode 9 is formed on the base substrate having the PVX layer 8 formed thereon, as illustrated in FIG. 2G.

As an example, a metal, film with low resistivity and high reflectivity (such as aluminum, titanium or the like) is deposited on the base substrate having the PVX layer formed thereon, and a pattern of the common electrode having slits is formed through a seventh photolithography and a wet etching process.

In at least one embodiment of the invention, the common electrode is made of a metal material. As the electrical conductivity of the metal is higher than that of ITO, the common electrode fabricated in the embodiment of the invention has a better charging performance and a short charging time.

In at least one embodiment of the invention, the transflective TFT array substrate is fabricated through seven photolithograph processes, thereby omitting a separate step for fabricating the reflective layer. As the common electrode in the TFT array substrate is made of a metal material having better reflectivity and has slit configuration, the slits in the common electrode can transmit ambient light, which will not affect normal deflection of the liquid crystals. Meanwhile, the strip electrodes in the common electrode can reflect ambient light. Moreover, the common electrode made of the metal material has a relatively low resistance, which helps to enhance the charging capacity of the common electrode, shortening the charging time.

Example 2

Figure 3A:
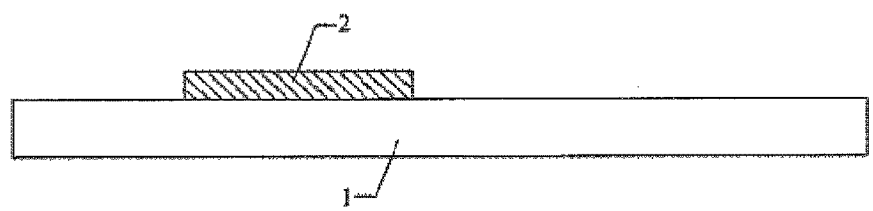
FIGS. 3A~3F schematically illustrate individual steps of fabricating a TFT array substrate in accordance with another embodiment of the invention.

FIGS. 3A-3F schematically illustrate cross sections take along A-A of FIG. 1B. With reference to FIGS. 3A-3F, a method for fabricating the TFT array substrate in accordance with the embodiment comprises the following steps:

(1) A gate electrode 2 is formed on a base substrate 1, as illustrated in FIG. 3A;

As an example, a metal layer (such as molybdenum Mo, aluminum Al, and so on) is deposited on the base substrate (such as a glass substrate) and a pattern of the gate electrode is formed through a first photolithography and a wet etching process.

Figure 3B:
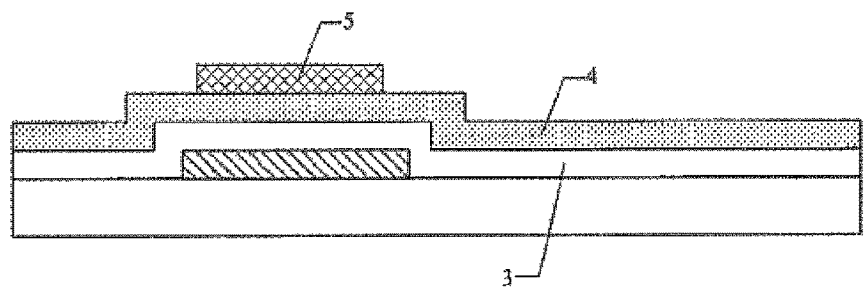

(2) A gate insulation layer 3, an active layer 4 and an etch stop layer 5 are formed on the base substrate having the gate electrode 2 formed thereon, as illustrated in FIG. 3B;

As an example, a gate insulation (GI) film, an oxide semiconductor film and an etch stop film are subsequently deposited on the base substrate having the gate electrode formed thereon, and a pattern of an etch stop layer is formed through a second photolithography and a dry etching process. Thereafter, positive ions are implanted to transform the oxide semiconductor in the non-etch stop layer region to electrically conductive oxide so as to form the active layer.

In some embodiments, the active layer is made of amorphous silicon.

Figure 3C:
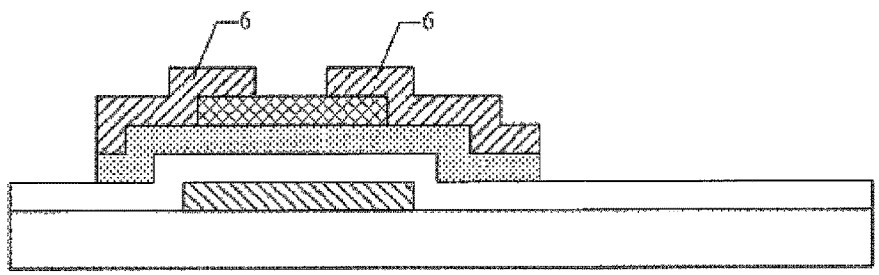

(3) A source/drain electrode 6 is formed on the base substrate having the etch stop layer 5 formed thereon, as illustrated in FIG. 3C.

As an example, a metal film (such as aluminum Al, titanium. Ti, and the like) is deposited on the base substrate having the etch stop layer formed thereon, and the source/drain electrode is formed through a third photolithography and a wet etching process which subsequently etch off the metal layer and the oxide layer.

Figure 3D:
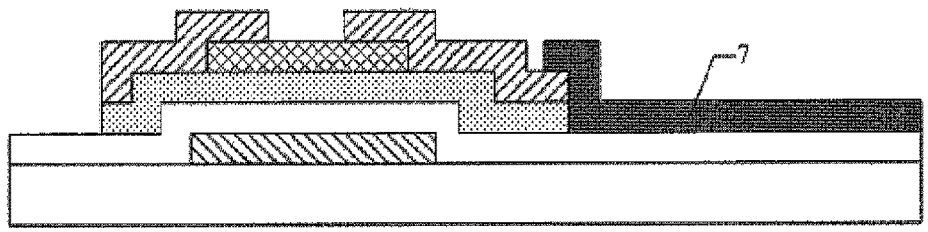

(4) A pixel electrode 7 is formed on the base substrate having the source/drain electrode 6 formed thereon, as illustrated in FIG. 3D.

As an example, a transparent conductive film (such as an ITO film and the like) is deposited on the base substrate having the source/drain electrode formed thereon, and the pixel electrode is formed through a fourth photolithography and a wet etching process.

Figure 3E:
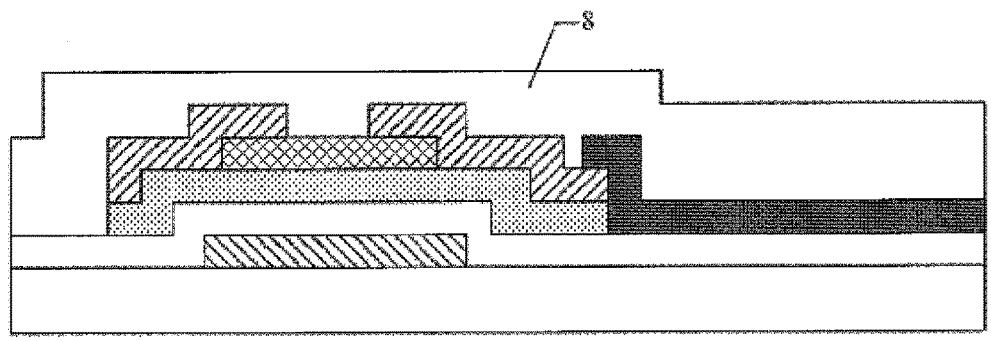

(5) An insulation protection (PVX) layer 8 is formed on the base substrate having the pixel electrode 7 formed thereon, as illustrated in FIG. 3E.

As an example, a PVX layer film (such as SiN, SiO2 and the like) is deposited on the base substrate having the pixel electrode formed thereon, and a PVX via hole corresponding to a peripheral circuit is formed through a fifth photolithography and a dry etching process.

Figure 3F:
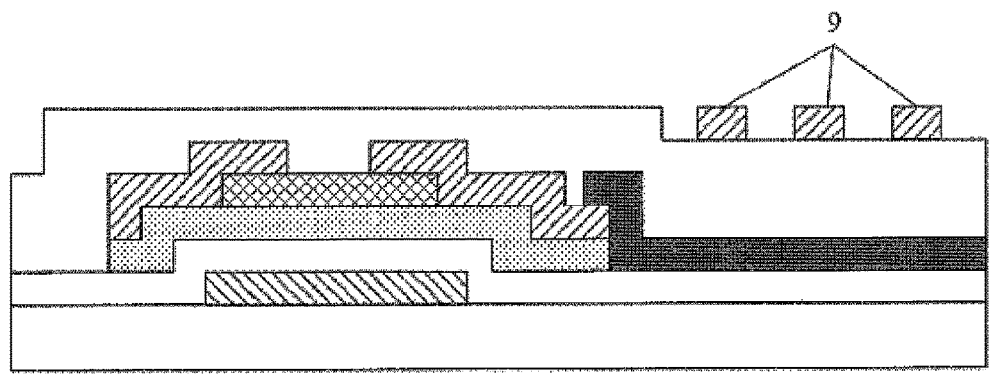

(6) A common electrode 9 is formed on the base substrate having the PVX layer 8 formed thereon, as illustrated in FIG. 3F.

As an example, a metal film with low resistivity and high reflectivity (such as aluminum, titanium or the like) is deposited on the base substrate having the PVX layer formed thereon, and a pattern of a common electrode having slits is formed through a sixth photolithography and a wet etching process.

In at least one embodiment of the invention, the common electrode is made of a metal material. As the electrical conductivity of metals is higher than that of ITO, the common electrode fabricated according to the embodiment of the invention has a better charging performance and a short charging time.

In at least one embodiment of the invention, the transflective TFT array substrate is fabricated through six photolithography processes, thereby omitting a separate step for fabricating the reflective layer. As the common electrode in the TFT array substrate is made of a metal material having better reflectivity and slit configuration, the slits in the common electrode can transmit ambient light, which will not affect normal deflection of the liquid crystals. Meanwhile, the strip electrodes in the common electrode can reflect ambient light. Moreover, the common electrode made of the metal material has a relatively low resistance, which helps to enhance the charging capacity of the common electrode, shortening the charging time.

An embodiment of the invention further provides a transflective LCD panel comprising a TFT array substrate in accordance with any of the aforementioned embodiments of the invention.

In the transflective LCD panel of the embodiment of the invention, the common electrode in each of the pixel units of the TFT array substrate is comb-shaped, allowing the strip electrodes in the common electrode to reflect light incident on the strip electrodes and the slits in the common electrode to transmit light incident on the slits. Therefore, the strip electrodes in the common electrode of each of the TFT array substrate may function as the reflective region of the array substrate and reflect ambient light, and the slits in the common electrode may function as the transmissive region of the array substrate and transmit ambient light.

An embodiment of the invention further provides a display device comprising the above TFT array substrate.

In the display device in accordance with the embodiment of the invention, the common electrode in each of the pixel units of the TFT array substrate is comb-shaped, allowing the strip electrodes in the common electrode to reflect light incident on the strip electrodes and the slits in the common electrode to transmit light incident on the slits. Therefore, the strip electrodes in the common electrode of each of the TFT array substrate may function as the reflective region of the array substrate and reflect ambient light, and the slits in the common electrode may function as the transmissive region of the array substrate and transmit ambient light.

The display device in accordance with the embodiment of the invention utilizes for example Advanced Super Dimension Switch (ADS) LCD technology or other LCD technologies.

The display device provided by the embodiment of the invention may be a LCD panel, an E-paper, an OLED panel, a mobile phone, a tablet PC, a television, a display device, a notebook PC, a digital photo-frame, a navigator and any product or component having a display function.

This application claims the priority of Chinese Application No. 201410008783.8, filed on Jan. 8, 2014 and which application is incorporated herein by reference.

What are described above is related to the illustrative embodiments of the disclosure only and not limitative to the scope of the disclosure; the scopes of the disclosure are defined by the accompanying claims.

What is claimed is:

1. A TFT array substrate, comprising: a plurality of pixel units, each of the plurality of pixel units comprising a common electrode, wherein the common electrode is comb-shaped, and the common electrode comprises a plurality of strip electrodes and a plurality of slits, wherein each of the strip electrodes is configured for reflecting light incident on the strip electrode, and each of the slits is configured for transmitting light incident on the slit, and all of the plurality of strip electrodes and the plurality of slits are extended in one and the same direction in each pixel unit;

wherein the TFT array substrate further comprises a plurality of gate signal lines and a plurality of data signal lines disposed as intersecting each other, the slits are disposed obliquely as having an angle with the gate signal lines, and the angle is greater than 0 and smaller than 90 degrees.

2. The TFT array substrate of claim 1, wherein a material of the strip electrodes is a metal with a resistivity equal to or less than 50 Ω/cm2 and has reflective property.

3. The TFT array substrate of claim 2, wherein the material of the strip electrodes is aluminum or titanium.

4. The TFT array substrate of claim 1, wherein the plurality of strip electrodes are of a same width.

5. The TFT array substrate of claim 1, wherein the plurality of slits are of a same width.

6. The TFT array substrate of claim 1, wherein a ratio between a total area of the plurality of strip electrodes and that of the plurality of slits is 3:5.

7. A display device, comprising the TFT array substrate of claim 1.

8. A method for fabricating a TFT array substrate, wherein the TFT array substrate comprises a comb-shaped common electrode, the method comprising:

forming a pattern of the comb-shaped common electrode through a single patterning process, wherein the comb-shaped common electrode comprises a plurality of strip electrodes and a plurality of slits, each of the strip electrodes is configured for reflecting light incident on the strip electrode, and each of the slits is configured for transmitting light incident on the slit;

wherein all of the plurality of strip electrodes and the plurality of slits are extended in one and the same direction in each pixel unit;

the method further comprising forming a plurality of gate signal lines and a plurality of data signal lines disposed as intersecting each other, wherein the slits are disposed obliquely as having an angle with the gate signal lines, and the angle is greater than 0 and smaller than 90 degrees.

9. The method of claim 8, further comprising:

providing a base substrate;

forming a gate electrode on the base substrate;

forming a gate insulation layer, an active layer and an etch stop layer on the base substrate having the gate electrode formed thereon;

forming a source/drain electrode on the base substrate having the etch stop layer formed thereon;

forming a pixel electrode on the base substrate having the source/drain electrode formed thereon; and forming an insulation protection layer on the base substrate having the pixel electrode formed there on;

wherein the common electrode is formed on the insulation protection layer.

* * * * *